(12) United States Patent
Saito et al.

(10) Patent No.: US 8,673,450 B2
(45) Date of Patent: Mar. 18, 2014

(54) GRAPHITE MEMBER FOR BEAM-LINE INTERNAL MEMBER OF ION IMPLANTATION APPARATUS

(75) Inventors: Kiyoshi Saito, Kanonji (JP); Fumiaki Yokoyama, Kanonji (JP); Hitoshi Suzuki, Kanonji (JP); Atsuko Ando, Kanonji (JP); Tetsuro Tojo, Osaka (JP); Seiji Shinohara, Saijo (JP)

(73) Assignee: Toyo Tanso Co., Ltd., Osaka (JP)

( * ) Notice: Subject to any disclaimer, the term of this patent is extended or adjusted under 35 U.S.C. 154(b) by 1189 days.

(21) Appl. No.: 12/084,206

(22) PCT Filed: Oct. 12, 2006

(86) PCT No.: PCT/JP2006/320791
§ 371 (c)(1),
(2), (4) Date: Jul. 10, 2008

(87) PCT Pub. No.: WO2007/049492
PCT Pub. Date: May 3, 2007

(65) Prior Publication Data
US 2009/0181527 A1    Jul. 16, 2009

(30) Foreign Application Priority Data
Oct. 28, 2005 (JP) ................................. 2005-315400

(51) Int. Cl.
| | | |
|---|---|---|
| A61N 5/00 | (2006.01) | |
| G21K 5/10 | (2006.01) | |
| H01J 37/08 | (2006.01) | |
| G21G 5/00 | (2006.01) | |
| C01B 31/00 | (2006.01) | |
| C01B 31/02 | (2006.01) | |
| C01B 31/04 | (2006.01) | |
| H01L 21/425 | (2006.01) | |

(52) U.S. Cl.
USPC ............... 428/448; 250/492.21; 250/492.3; 264/29.1; 264/29.5; 264/29.7; 423/445 R; 438/514

(58) Field of Classification Search
USPC ............... 250/492.21, 492.3; 264/29.1, 29.5, 264/29.7; 423/445 R, 448; 438/514
See application file for complete search history.

(56) References Cited

U.S. PATENT DOCUMENTS

| | | | |
|---|---|---|---|
| 3,506,745 A | | 4/1970 | Juel et al. |
| 4,190,637 A | * | 2/1980 | Kennedy ........................ 423/448 |
| 2003/0122089 A1 | * | 7/2003 | Murrell et al. ............ 250/492.21 |

FOREIGN PATENT DOCUMENTS

| | | |
|---|---|---|
| GB | 871 068 | 6/1961 |
| JP | 04-149066 | 5/1992 |

(Continued)

OTHER PUBLICATIONS http://www.toyotanso.co.jp/Products/Special_graphite_detail_en.html, Internet Retrieval Date: May 11, 2011.*

(Continued)

*Primary Examiner* — Jonathan Langman
(74) *Attorney, Agent, or Firm* — Wenderoth, Lind & Ponack, L.L.P.

(57) ABSTRACT

The problem of the present invention is to provide, in high current-low energy type ion implantation apparatuses, a graphite member for a beam line inner member of an ion implantation apparatus, which graphite member can markedly reduce particles incorporated in a wafer surface. This problem can be solved by the graphite member of the present invention, which is a graphite member for a beam line inner member of an ion implantation apparatus, which member having a bulk density of not less than 1.80 Mg/m$^3$ and an electric resistivity of not more than 9.5 μΩ·m. Preferably, the R value obtained by dividing D band intensity at 1370 cm$^{-1}$ by G band intensity at 1570 cm$^{-1}$ in the Raman spectrum of a spontaneous fracture surface of the graphite member is not more than 0.20.

13 Claims, 2 Drawing Sheets

(56) References Cited

FOREIGN PATENT DOCUMENTS

| JP | 07-302568 | 11/1995 |
|---|---|---|
| JP | 09-199073 | 7/1997 |
| JP | 11-168069 | 6/1999 |
| JP | 2000-323052 | 11/2000 |
| JP | 2000-331952 A | 11/2000 |
| JP | 2003-197144 | 7/2003 |
| JP | 2004-158226 | 6/2004 |
| JP | 2004-158226 A | 6/2004 |
| JP | 2005-179140 | 7/2005 |
| JP | 2005-179140 A | 7/2005 |
| JP | 2005-200239 A | 7/2005 |

OTHER PUBLICATIONS

Kimura et al., "Microstructure of Diamond-like Carbon Films prepared by Cathodic arc Deposition", Diamond and Related Materials, vol. 11, 2002, pp. 1436-1440.*

Machine English Translation of JP 2000-331952 to Sony Corporation, provided by the JPO website, retrieved May 19, 2011.*

Machine English Translation of JP 2005-200239 to Toyo Tanso, provided by the JPO website, retrieved May 19, 2011.*

Japanese First Official Action issued Apr. 24, 2006 in connection with Japanese Patent Application No. 315400/2005 corresponding to present U.S. application.

Japanese Final Official Action issued Aug. 1, 2007 in connection with Japanese Patent Application No. 315400/2005 corresponding to present U.S. application.

Supplementary European Search Report (in English language) issued Mar. 31, 2011 in corresponding European Patent Application No. 06 82 1949.

Office Action issued Nov. 25, 2013 in corresponding European Application No. 06 821 949.2.

Mantell, C., "Carbon and Graphite Handbook", 1979, Robert E. Krieger Publishing Company, pp. 323-344.

* cited by examiner

GRAPHITE MEMBER FOR BEAM-LINE INTERNAL MEMBER OF ION IMPLANTATION APPARATUS

TECHNICAL FIELD

The present invention relates to a graphite member for a beam line inner member of an ion implantation apparatus to be used for an ion implantation apparatus that implants ion in a semiconductor substrate and the like. A beam line inner member is a member for an inner vacuum space of an ion implantation apparatus, and specifically includes an ion source inner member, an inner member of a beam pathway from an ion source to an implantation treatment chamber and an inner member of an implantation treatment chamber.

BACKGROUND ART

One of the steps for processing a semiconductor device is ion implantation of impurity elements in a semiconductor wafer substrate such as silicon, silicon carbide (SiC), gallium arsenide (GaAs), gallium nitride (GaN) and the like to be a substrate. FIG. 2 is a schematic view of one embodiment of an ion implantation apparatus to be used in said step. An ion implantation apparatus 10 is an apparatus for ionizing a desired impurity element, accelerating the element to a given energy, and impacting same against a semiconductor substrate (wafer substrate 16) and the like. The ion implantation apparatus 10 shown in the Figure is provided with an ion source 11 that generates ions by affording a gas in a plasma state and containing a desired impurity element, an extractor electrode 12 for extracting generated ions, a separating electromagnet 13 for selecting desired ions from the extracted ions, an accelerating electrode 14 for accelerating ions, and a deflecting electrode 15 for deflecting the accelerated ions, where the deflected ions of the impurity element are impacted against (implanted in) a wafer substrate 16 set in front of a beam stop 17 through a shutter 18 and a cassette 19. The dotted line in the Figure shows the progress of the ions to be implanted.

The material constituting each part of the ion implantation apparatus is required to be a high purity material showing superior heat resistance and superior thermal conductivity, less ablation (erosion) due to the ion beam, and a low impurity content. For example, graphite materials used as materials for flight tubes, various kinds of slits, electrodes, electrode covers, guide tubes, beam stop and the like are employed. Particularly, high density and high intensity graphite members have been conventionally used for a high energy ion implantation apparatus wherein the energy of impurity element ion implantation is not less than 1 MeV. Patent references relating to these prior arts are, for example, JP-A-8-45467, JP-A-9-199073, JP-A-10-12180, JP-A-2000-323052, JP-A-2004-158226, US-B-2003/38252 and US-B-2003/79834.

In addition to the aforementioned techniques, a graphite member coated or impregnated with glassy carbon or pyrolytic carbon may be used as a beam line inner member of an ion implantation apparatus. Patent references relating to this prior art are, for example, JP-A-9-63522, JP-A-8-171883, JP-A-7-302568, JP-A-2000-128640 and JP-A-11-283553.

The graphite material is made by sintering coke to be an aggregate and a binder. Therefore, use of a graphite material for an ion implantation apparatus is feared to give rise to problems of contamination of the inside of an ion implantation apparatus by graphite particles fallen off due to the ion beam, and decreased yield of a semiconductor device due to incorporation of the particles in a wafer substrate. Moreover, a problem of ablation of graphite member due to ion beam irradiation is also feared.

In recent years, the gate length of an MOS device is becoming not more than 90 nm along with downsizing of the design rule of integrated circuit devices and super high densification and ultra high speed achieved by integrated circuit devices. As an ion implantation technique to realize the above, ultra-shallow distribution of implanted impurity is required. The ultra-shallow distribution enables ultra-shallow junction of source/drain. Thus, plasma doping as a low-energy ion implantation method and low-energy ion implantation by decelerating electric fields have been studied and developed. Under such situation, ion irradiation energy on graphite in a beam line, i.e., acceleration voltage, sometimes becomes lower than the conventional level, for example, about 2 keV or below. With high energy, ion implantation is possible, but with low energy, sputtering may occur.

DISCLOSURE OF THE INVENTION

The new finding by the present inventors has revealed that the following conventionally unexperienced problems may be developed by low energy ion implantation. When low energy ion implantation was tried, sputtering occurred on the surface of a graphite member, thus increasing the probability of submicron carbon particles reaching the wafer as undesired particles. Since a compact apparatus shortens the distance between a beam stop and a wafer, undesired implantation of ultrafine carbon particles, generated by narrowing down the beam with a beam slit, in a wafer was also developed problematically.

In view of such situation, the present invention aims at providing a graphite member for a beam line inner member of an ion implantation apparatus, which member can markedly decrease the particles incorporated into the surface of a processing object (wafer etc.) in a high electric current, low energy ion implantation method.

The present invention is characterized by the following.
(1) A graphite member for a beam line inner member of an ion implantation apparatus, which has a bulk density of not less than 1.80 $Mg/m^3$ and electric resistivity of not more than 9.5 $\mu\Omega \cdot m$.
(2) The graphite member of (1), having an R value of not more than 0.20, wherein the R value is obtained by dividing D band intensity at 1370 $cm^{-1}$ by G band intensity at 1570 $cm^{-1}$ in the Raman spectrum of a spontaneous fracture surface of the graphite member.
(3) The graphite member of (1) or (2), having an ash content of not more than 10 ppm.
(4) A production method of the graphite member of claim 1, comprising
compressing a powder of a carbon material to give a formed compact, calcining the obtained compact and immersing the compact in a pitch, heating the compact to 2500° C. or above for graphitizing, immersing the compact in a pitch and heating the compact again to not less than 2500° C. or above for graphitizing.
(5) The graphite member of any of (1) to (3), which is for use as an inner member of an ion implantation apparatus that implants ions with an ion implantation energy of 70 keV or below.
(6) The graphite member of any of (1) to (3), which is to be used as an inner member of an ion implantation apparatus that implants ions with an ion implantation energy of less than 10 keV.

(7) The graphite member of any of (1) to (3), which is to be used for an ion implantation apparatus for forming a shallow junction by implanting ions with an ion implantation energy of less than 1 keV.

(8) A method of implanting ions in a processing object, comprising passing ions with an acceleration voltage of 70 keV or below through a beam line provided with an inner member composed of the graphite member of any of (1) to (3), and allowing the ions to impact a processing object.

(9) The method of (8), wherein the acceleration voltage is less than 10 keV.

(10) The method of (8) or (9), wherein the processing object is a semiconductor substrate.

The graphite member for a beam line inner member of an ion implantation apparatus of the present invention (hereinafter to be also simply indicated as a graphite member) can markedly reduce the particles incorporated into the surface of a processing object (wafer etc.) during low energy ion implantation. While the present specification sometimes explains wafer as a typical example of the processing object, the processing object is not limited to wafer.

10 ion implantation apparatus, 11 ion source, 12 extraction electrode, 13 separation electromagnet, 14 acceleration electrode, 15 deflection electrode, 16 wafer substrate, 17 beam stop, 18 shutter, 19 cassette.

BEST MODE FOR CARRYING OUT THE INVENTION

The graphite member of the present invention has a bulk density of not less than 1.80 Mg/m$^3$, preferably not less than 1.84 Mg/m$^3$. When the bulk density is less than 1.80 Mg/m$^3$, thermal diffusivity markedly decreases due to ablation by ion beam irradiation. As a result, carbon particles in an ion implantation apparatus may increase, and decrease the yield. In the present invention, a higher bulk density of a graphite member is more preferable. Since high purity can be easily achieved, for example, one example of the upper limit is 1.95 Mg/m$^3$. The graphite to be used for an ion implantation apparatus needs to be treated to achieve a high purity. However, when the bulk density is too high, the inside of the graphite cannot achieve a high purity with ease.

The bulk density of the graphite member is measured by a method based on JIS R7222-1997.

The graphite member of the present invention has an electric resistivity of not more than 9.5 μΩ·m, preferably not more than 8.5 μΩ·m. Lower electric resistivity is more preferable since the thermal conductivity of the graphite member becomes fine. In consideration of actual production and the like, the lower limit of the electric resistivity is, for example, 6.8 μΩ·m. When the electric resistivity is higher than 9.5 μΩ·m, particles are incorporated in a wafer surface.

The electric resistivity of the graphite member is also measured by a method based on JIS R7222-1997.

Examples of preferable graphite member include those having high crystallinity. The crystallinity of a graphite member can be quantified by R value calculated from Raman spectrum. In the present invention, the R value of a graphite member is preferably not more than 0.20, more preferably not more than 0.18. A smaller R value is more preferable. When the R value exceeds 0.20, carbon particles are easily generated.

The R value of a graphite member can be determined as follows.

Figure 1:
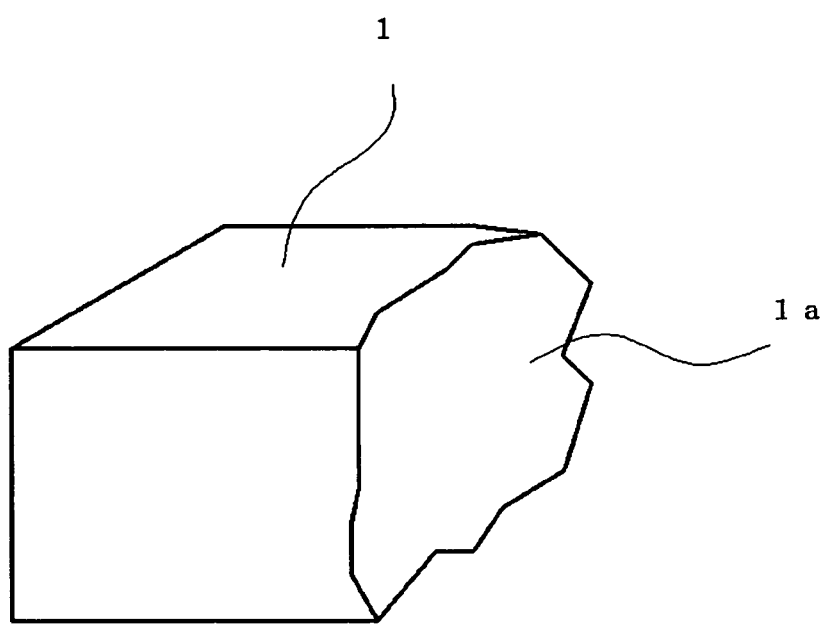
FIG. 1 is a schematic diagram of a graphite member after breaking.
Figure 2:
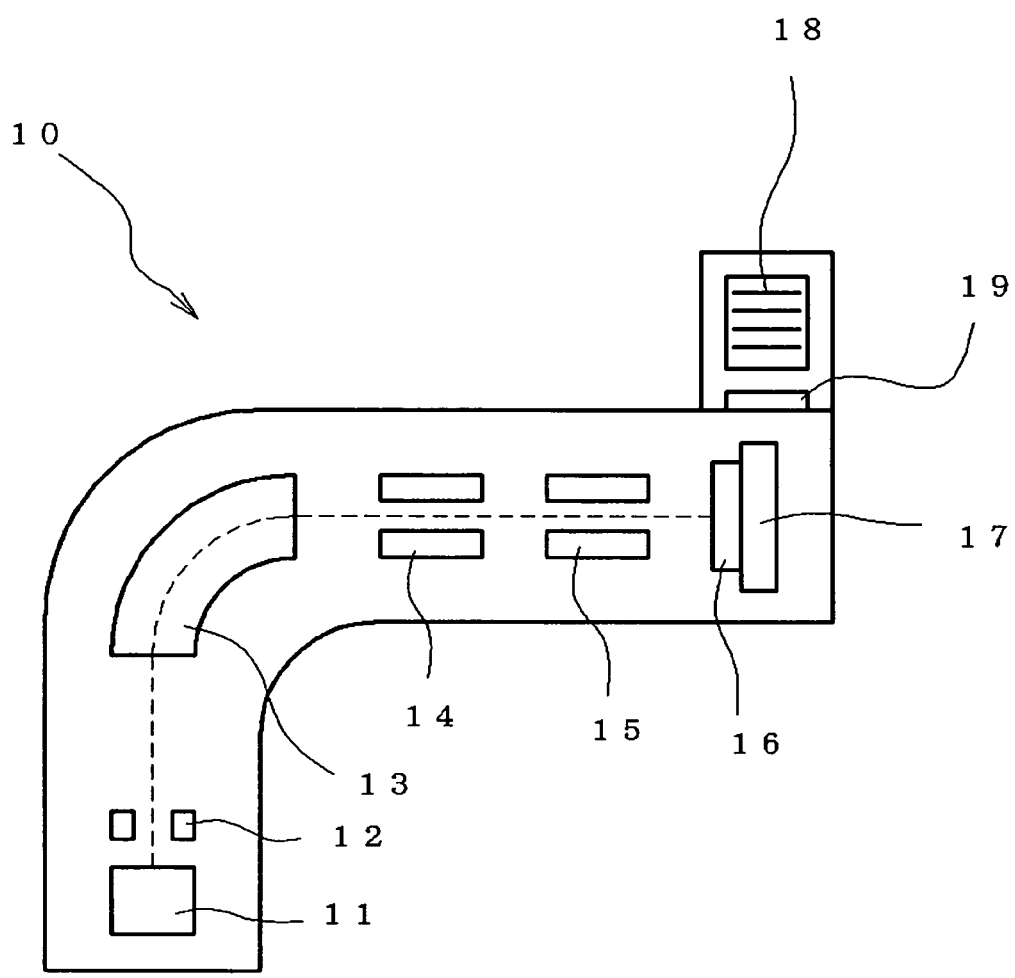
FIG. 2 is a schematic view of one embodiment of the ion implantation apparatus. The symbol 1 in FIG. 1 shows a graphite member for a beam line inner member of an ion implantation apparatus and each symbol in FIG. 2 means the following.

A 20 mm×20 mm×100 mm graphite member is fractured (broken) near the center by a flexural strength tester. FIG. 1 is a schematic diagram of a graphite member after breaking. A spontaneous fracture surface of a graphite member 1 is shown with symbol 1a. The spontaneous fracture surface refers to a fracture surface left as broken, which is free of a surface treatment such as polishing and the like. The spontaneous fracture surface 1a is subjected to Raman spectroscopic analysis to obtain a Raman spectrum. The spectrum intensity (D band intensity) at 1370 cm$^{-1}$ and spectrum intensity (G band intensity) at 1570 cm$^{-1}$ are determined from the obtained spectrum. R value is calculated from (D band intensity) (G band intensity).

For preferable production of a graphite material in the present invention, for example, a method comprising kneading a coke pulverized powder and a binder, pulverizing the mixture, which is followed by forming, calcining, graphitizing (first graphitizing), pitch impregnation and graphitizing again can be employed. The first and second graphitizing is performed by a heat treatment at preferably not less than 2500° C., more preferably not less than 2700° C., still more preferably 2900-3200° C. Pitch impregnation may precede the first graphitizing. More specifically, the following non-limiting example can be mentioned.

Coke (calcined product of petroleum pitch coke or coal pitch coke, or raw coke) used as a starting material is pulverized with a mill such as a hammer mill and the like to give a coke powder. A material obtained by kneading the resulting coke powder and a binder pitch and pulverizing the mixture, or a mesophase or raw coke pulverized powder with self sinterability is formed with a rubber press. In this case, other carbon materials can also be used besides raw coke. The obtained formed compact is calcined at preferably 900-1300° C., more specifically about 1000° C. Then, the formed compact is graphitized at the aforementioned temperature. Pitch impregnation and subsequent calcining may be performed one or more times before graphitizing. To afford a high density product, pitch impregnation and subsequent graphitizing are performed as necessary after graphitizing. The step of pitch impregnation and subsequent graphitizing may be performed one or more times. Pitch impregnation is a step for increasing the bulk density by impregnating carbon pores with a pitch at a high pressure to cause carbonizing, thus increasing the bulk density. Preferably, a high purity treatment is appropriately performed by the use of a halogen gas or halogen-containing gas and the like, whereby the impurity contained in the obtained graphite member is set to not more than 50 ppm, more preferably not more than 10 ppm. A graphite member that underwent a high purity treatment can be appropriately shape-processed and used as a graphite member for an ion implantation apparatus.

Use of the graphite member of the present invention is explained below.

As shown in the section of Background Art, an ion implantation apparatus is used for ion implantation of impurity element in a processing object such as a semiconductor substrate and the like. Ion implantation is performed by placing a gas containing a desired impurity element in a plasma state to cause ion generation, extracting the ions as an ion beam, appropriately selecting the beam, accelerating the ion beam with a given acceleration voltage and, after deflection and the like as necessary, allowing the beam to impact a processing object (e.g., semiconductor substrate, wafer).

The graphite member of the present invention is used as a beam line inner member of an ion implantation apparatus, and particularly used for ion implantation with an ion implantation energy of not more than 70 keV, and further, less than 10 keV. An ion implantation energy of not more than 70 keV means that an acceleration voltage is not more than 70 kV. The graphite member of the present invention is used as a beam line inner member of an ion implantation apparatus. A beam line inner member constitutes an inner vacuum space in an ion implantation apparatus, which is exemplified by an ion source inner member, an inner member of a beam pathway from an ion source to an implantation treatment chamber, an implantation treatment chamber inner member and the like. More specifically, examples thereof include materials constituting beam line tubes, various slits and apertures, electrodes, electrode covers, beam guide tubes, beam stops and the like. The effect of the present invention is particularly exteriorized when used as a beam measuring apparatus, an implantation treatment chamber wall material and the like. A beam line inner member itself which is at least partly constituted with the aforementioned graphite member is also encompassed in the present invention. In addition, ion implantation apparatus, wherein a beam line inner member is at least partly constituted with the aforementioned graphite member, is also encompassed in the present invention. Furthermore, a method of implanting ions in a processing object, comprising passing ions with the aforementioned acceleration voltage through a beam line provided with an inner member composed of the aforementioned graphite member, and allowing the ions to impact the processing object, is also encompassed in the present invention.

It is preferable to use the graphite member of the present invention for forming a shallow junction.

The "shallow junction" is a processing step for forming a shallow impurity diffusion layer having a junction depth of several dozen nm, which is a junction method employed for advanced silicon semiconductor devices. For shallow ion implantation to form a shallow junction, several hundred-several keV, preferably less than 1 keV, of acceleration energy (ion implantation energy) is generally applied.

The dose of ions to be applied to a processing object (semiconductor substrate and the like) using the graphite member of the present invention is preferably $10^{11}$-$10^{16}$ ion/cm$^2$·sec. Since sputtering easily occurs when the ion dose is within the above-mentioned range, the effect of the present invention is exteriorized.

The outline of the present invention is explained once again in the following.

For ion implantation apparatuses, the following two kinds of contamination are largely problematic. One is contamination with impurity, which is caused by implantation of elements other than those desired. The other is implantation of ions in areas other than the object region, which is caused by variation of energy accelerating a beam since ionic charge has changed due to collision with particles; in other words, energy contamination.

In ion implantation, particles give rise to a problem as discussed below.

Conventionally, since the line width of a pattern circuit of a semiconductor was relatively large, particles of a submicron order mainly comprising carbon particles did not pose any problems. In the case of a shallow junction, however, dispersion in the implant depth, which is mainly caused by energy contamination, poses a problem. Dispersion in the implant depth develops a problem of electric current leakage. In other words, stand-by power consumption becomes high.

In connection with particles from graphite materials, the following are the main points.

1. Sputtering Rate should Decrease.

Sputtering is largely divided into 3 kinds of physical sputtering, chemical sputtering and sublimation enhanced sputtering. Consumption of graphite member caused by ion irradiation can be suppressed by lowering the sputtering rate, which is achieved by decreasing the surface temperature. It is considered that the surface temperature can be decreased by increasing the thermal diffusivity and specific heat of a carbon substrate. Since the thermal conductivity is a product of thermal diffusivity and specific heat, when thermal diffusion and specific heat are threshold values or below, the results could be defective even when thermal conductivity is high. An example thereof is given below. As a material with high thermal conductivity but a low specific heat, an electrode material is considered and, as an electrode material, a material with a bulk density of about 1.65 Mg/cm$^3$ and thermal conductivity of 200 W/(m·K) is given as an example. When the material is consumed by sputtering in this case, thermal conductivity may strikingly decrease since specific gravity and specific heat decrease.

2. Gas should not be Generated.

Carbon has a thermal history of from about 2600° C. to about 3000° C. When carbon reaches a temperature not less than the thermal history due to ion irradiation, a gas is released from the inside of carbon. This gas is considered to be submicron carbon particles and a particle source.

A specific design guideline for a graphite material is considered to be the following.

The present inventors considered it most important to prevent scattering of phonon to increase thermal conductivity. It is important to develop a material with high specific gravity while preventing scattering of phonon. To increase the free path length of phonon, a material free of interface is desired, which is generally achieved by increasing the size of a filler. In conventional isotropic graphites, however, a filler having an increased particle size has low specific gravity, and a decrease in the specific heat is feared. To prevent this, the specific gravity may be increased by repeating pitch impregnation. However, repetitive pitch impregnation of a calcined product fails to achieve high thermal conductivity, though it increases specific gravity.

Hence, the present invention has introduced ideas given as examples in the following.

(1) By pitch impregnation of a once graphitized material, a condition after pseudo-use of large particles is produced, and the specific gravity is increased.

(2) A thermal history is imparted to a graphite material after completion of graphitization by subjecting the material to pitch impregnation, a heat treatment, and a further heat treatment at, for example, 2900-3200° C., to enhance the graphitization level, thereby enhancing the thermal conductivity, so that the material can be used as a graphite member for ion implantation.

(3) A gas contained inside a graphite member is released in advance to keep the vapor pressure low, and ion implantation is performed under high vacuum.

EXAMPLES

The present invention is explained in more detail in the following by referring to Examples, which are not to be construed as limitative.

Example 1

Coal pitch coke (100 parts by weight) having an average particle size of 10 μm was used as a filler, coal tar pitch (binder) (57 parts by weight) was added thereto, and the mixture was kneaded for about 3 hours. The obtained kneaded mixture was pulverized to give a pulverized powder with an average particle size of 35 μm. The pulverized powder was subjected to cold isostatic pressing to give a 340×570× 1000 (mm) raw formed compact. The compact was calcined at about 1000° C., and pitch impregnation and calcining were repeated several times. Thereafter, a graphitizing treatment was applied at about 3000° C. Then, the compact was impregnated with the pitch, calcined, and graphitized again at about 3000° C.

A 20×20×60 (mm) test piece was cut out from the graphitized product, and physical properties were measured. The measurement results are shown in Table 1. The graphitized product was machined to give a graphite member for ion implantation apparatus, and the member was subjected to a high purity treatment in a halogen gas under reduced pressure at 2000° C. to lower the ash content to 10 ppm. The obtained graphite member was cleaned in pure water by ultrasonication, incorporated in a high current-low energy type ion implantation apparatus and subjected to ion implantation in a silicon wafer.

Example 2

Petroleum coke (100 parts by weight) having an average particle size of 10 μm was used as a filler, coal tar pitch (binder) (57 parts by weight) was added thereto, and the mixture was kneaded for about 3 hours. The obtained kneaded mixture was pulverized to give a pulverized powder with an average particle size of 35 μm. The pulverized powder was subjected to cold isostatic pressing to give a 340×570× 1000 (mm) raw formed compact. The compact was calcined at about 1000° C., and pitch impregnation and calcining were repeated several times. Thereafter, a graphitizing treatment was applied at about 3000° C. Then, the compact was impregnated with the pitch and graphitized again at about 3100° C.

Example 3

Petroleum coke (100 parts by weight) having an average particle size of 10 μm was used as a filler, coal tar pitch (binder) (55 parts by weight) was added thereto, and the mixture was kneaded for about 2 hours. The obtained kneaded mixture was pulverized to give a pulverized powder with an average particle size of 35 μm. The pulverized powder was subjected to cold isostatic pressing to give a 340×570× 1000 (mm) raw formed compact. The compact was calcined at about 1000° C., and pitch impregnation and calcining were repeated several times. Thereafter, a graphitizing treatment was applied at about 3000° C. Then, the compact was impregnated with the pitch, calcined, cut out in 100×300×600 (mm), impregnated again with the pitch, calcined and graphitized at about 3000° C.

Example 4

Petroleum coke (100 parts by weight) having an average particle size of 10 μm was used as a filler, coal tar pitch (binder) (5755 parts by weight) was added thereto, and the mixture was kneaded for about 2.5 hours. The obtained kneaded mixture was pulverized to give a pulverized powder with an average particle size of 35 μm. The pulverized powder was subjected to cold isostatic pressing to give a 100×300× 600 (mm) raw formed compact. The compact was calcined at about 1000° C., and pitch impregnation and calcining were repeated several times. Thereafter, a graphitizing treatment was applied at about 2500° C. Then, the compact was impregnated with the pitch and graphitized again at about 3000° C.

Example 5

Petroleum coke (100 parts by weight) having an average particle size of 10 μm was used as a filler, coal tar pitch (binder) (54 parts by weight) was added thereto, and the mixture was kneaded for about 2 hours. The obtained kneaded mixture was pulverized to give a pulverized powder with an average particle size of 35 μm. The pulverized powder was subjected to cold isostatic pressing to give a 100×300× 600 (mm) raw formed compact. The compact was calcined at about 1000° C., and pitch impregnation and calcining were repeated several times. Thereafter, a graphitizing treatment was applied at about 3000° C. Then, the compact was impregnated with the pitch and graphitized again at about 3000° C.

Example 6

Petroleum coke (100 parts by weight) having an average particle size of 10 μm was used as a filler, coal tar pitch (binder) (63 parts by weight) was added thereto, and the mixture was kneaded for about 4 hours. The obtained kneaded mixture was pulverized to give a pulverized powder with an average particle size of 35 μm. The pulverized powder was subjected to cold isostatic pressing to give a 80×200×300 (mm) raw formed compact. The compact was calcined at about 1000° C. and, after pitch impregnation and calcining, graphitized at about 3100° C. Then, the compact was impregnated with the pitch and graphitized again at about 3000° C.

Example 7

Petroleum coke (100 parts by weight) having an average particle size of 10 μm was used as a filler, coal tar pitch (binder) (63 parts by weight) was added thereto, and the mixture was kneaded for about 4 hours. The obtained kneaded mixture was pulverized to give a pulverized powder with an average particle size of 35 μm. The pulverized powder was subjected to cold isostatic pressing to give a 100×300× 600 (mm) raw formed compact. The compact was calcined at about 1000° C., and pitch impregnation and calcining were repeated several times. Thereafter, a graphitizing treatment was applied at about 3000° C. Then, the compact was impregnated with the pitch, calcined, cut out in 50×300×600 (mm), impregnated with the pitch again, calcined, and graphitized again at about 3100° C.

Comparative Example 1

A mesophase pitch was subjected to cold isostatic pressing to give a 80×200×300 (mm) raw formed compact. The compact was calcined at about 1000° C., and calcined at about 2500° C. A pitch impregnation treatment was not performed after the graphitizing treatment.

Comparative Example 2

Coal pitch coke was pulverized at an average particle size of 13 μm and 100 parts by weight thereof was used as a filler. Thereto was added a coal tar pitch (binder) (53 parts by weight) and the mixture was kneaded for about 1.5 hours. The obtained kneaded mixture was pulverized to give a pulverized powder with an average particle size of 35 µm. The pulverized powder was subjected to cold isostatic pressing to give a 300×540×850 (mm) raw formed compact. The compact was calcined at about 900° C., pitch impregnation and calcining were repeated several times, and calcined at about 3000° C. A pitch impregnation treatment was not performed after the graphitizing treatment.

Comparative Example 3

Raw coal pitch coke was pulverized at an average particle size of 8 µm and 100 parts by weight thereof was used as a filler. Thereto was added a coal tar pitch (binder) (50 parts by weight) and the mixture was kneaded for about 2 hours. The obtained kneaded mixture was pulverized to give a pulverized powder with an average particle size of 15 µm. The pulverized powder was subjected to cold isostatic pressing to give a 80×200×300 (mm) raw formed compact. The compact was calcined at about 1000° C., and graphitized at about 2500° C. A pitch impregnation treatment was not performed after the graphitizing treatment.

Comparative Example 4

Coal pitch coke was pulverized at an average particle size of 8 µm and 100 parts by weight thereof was used as a filler. Thereto was added a coal tar pitch (binder) (60 parts by weight) and the mixture was kneaded for about 2.5 hours. The obtained kneaded mixture was pulverized to give a pulverized powder with an average particle size of 2515 µm. The pulverized powder was subjected to cold isostatic pressing to give a 80×200×300 (mm) raw formed compact. The compact was calcined at about 1000° C., and graphitized at about 3000° C. A pitch impregnation treatment was not performed after the graphitizing treatment.

A 20×20×100 (mm) test piece was cut out from each of the graphitized products obtained in Examples 2-7 and Comparative Examples 1-4, and physical characters were measured. The measurement results are shown in Table 1. These graphitized products were subjected to machining, a high purity treatment and an ultrasonic cleansing in the same manner as in Example 1, incorporated into a high electric-low energy type ion implantation apparatus and subjected to ion implantation in a silicon wafer.

<Ion Implantation in Silicon Wafer>

A graphite member obtained in each of the Examples and Comparative Examples was incorporated as a beam stop member of a high current-low energy type ion implantation apparatus, and $B^{11}$ was continuously implanted in a silicon wafer with 7 keV energy for several dozen to several hundred hours. The ion dose at this time was $10^{15}$-$10^{16}$ ion/cm$^2$·sec. Thereafter, particles having a size of not less than 0.2 µm, which were present on the surface of the silicon wafer, were counted with a particle counter. The results are summarized in Table 1. In Examples 1-3, the number of particles on the Si wafer surface was not more than 40 per one wafer but it was not less than several hundred in Comparative Examples 1-4. Thus, the yield of the Si wafer was poor and caused problems.

TABLE 1

| | bulk density (Mg/m³) | resistance (µΩ·m) | R value (spontaneous fracture surface) | cumulative particle (particles/wafer) |
|---|---|---|---|---|
| Example 1 | 1.88 | 8.0 | 0.16 | 40 or less |
| Example 2 | 1.87 | 7.0 | 0.13 | 40 or less |
| Example 3 | 1.92 | 9.5 | 0.20 | 40 or less |
| Example 4 | 1.84 | 9.0 | 0.18 | 100 or less |
| Example 5 | 1.80 | 9.5 | 0.20 | 100 or less |
| Example 6 | 1.84 | 8.0 | 0.17 | 100 or less |
| Example 7 | 1.96 | 6.9 | 0.12 | 40 or less |
| Comparative Example 1 | 1.92 | 13.6 | 0.32 | several hundred or more |
| Comparative Example 2 | 1.78 | 9.5 | 0.22 | several hundred or more |
| Comparative Example 3 | 1.88 | 20.6 | 0.42 | several hundred or more |
| Comparative Example 4 | 1.79 | 9.7 | 0.24 | several hundred or more |

This application is based on application No. 2005-315400 filed in Japan, the contents of which are incorporated hereinto by reference.

The invention claimed is:

1. A graphite member,
which is obtained by subjecting a calcined product of coke powder and binder pitch to:
pitch impregnation and calcining, then
graphitizing at not less than 2500° C., then
pitch impregnation and calcining, and then
graphitizing at 3100° C.-3200° C., and
which has a bulk density of not less than 1.80 Mg/m³, and electric resistivity of not more than 9.5 µΩ·m, and an R value of not more than 0.20, wherein the R value is obtained by dividing D band intensity at 1370 cm$^{-1}$ by G band intensity at 1570 cm$^{-1}$ in the Raman spectrum of a spontaneous fracture surface of the graphite member.

2. The graphite member of claim 1, having an ash content of not more than 10 ppm.

3. The graphite member of claim 1, for use as an inner member of an ion implantation apparatus that implants ions with an ion implantation energy of 70 keV or below.

4. The graphite member of claim 1, for use as an inner member of an ion implantation apparatus that implants ions with an ion implantation energy of less than 10 keV.

5. The graphite member of claim 1, for use as an ion implantation apparatus for forming a shallow junction by implanting ions with an ion implantation energy of less than 1 keV.

6. A method of implanting ions in a processing object, comprising passing ions with an acceleration voltage of 70 keV or below through a beam line provided with an inner member composed of the graphite member of claim 1, and allowing the ions to impact a processing object.

7. The method of claim 6, wherein the acceleration voltage is less than 10 keV.

8. The method of claim 6, wherein the processing object is a semiconductor substrate.

9. A beam line inner member of an ion implantation apparatus,
which is made of a graphite material,
has a bulk density of not less than 1.80 Mg/m³, and electric resistivity of not more than 9.5 µΩ·m, and has an R value of not more than 0.20, the R value being obtained by dividing D band intensity at 1370 cm$^{-1}$ by G band intensity at 1570 cm$^{-1}$ in the Raman spectrum of a spontaneous fracture surface of the beam line inner member.

10. A production method of the beam line inner member of claim 9, comprising steps of:
subjecting a calcined product of coke powder and binder pitch to pitch impregnation and calcining, then
graphitizing the product at not less than 2500° C., then
subjecting the product to pitch impregnation and calcining, and then
graphitizing the product at 3100° C.-3200° C.

11. A method of suppressing generation of particles from a graphite inner member during ion implantation in an ion implantation apparatus that implants ions with an ion implantation energy of 70 keV or below, comprising
applying a graphite member as the graphite inner member of the ion implantation apparatus,
wherein the graphite member has
a bulk density of not less than 1.80 Mg/m$^3$,
an electric resistivity of not more than 9.5 μΩ·m, and
an R value of not more than 0.20, wherein the R value is obtained by dividing D band intensity at 1370 cm$^{-1}$ by G band intensity at 1570 cm$^{-1}$ in the Raman spectrum of a spontaneous fracture surface of the graphite member.

12. The method of claim 11, wherein the ion implantation energy is less than 10 keV.

13. The method of claim 11, wherein the graphite member used as the inner member is obtained by subjecting a calcined product of coke powder and binder pitch to:
pitch impregnation and calcining, then
graphitizing at not less than 2500° C., then
pitch impregnation and calcining, and then
graphitizing at 3100° C.-3200° C.

* * * * *